United States Patent
Park et al.

(10) Patent No.: US 11,085,982 B1
(45) Date of Patent: Aug. 10, 2021

(54) IMAGE ACQUISITION METHOD AND APPARATUS USING PARALLEL SCHEME OF RADIO FREQUENCY IRRADIATION AND DATA ACQUISITION

(71) Applicant: KOREA ADVANCED INSTITUTE OF SCIENCE AND TECHNOLOGY, Daejeon (KR)

(72) Inventors: Hyun Wook Park, Daejeon (KR); Byung Jai Kim, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 75 days.

(21) Appl. No.: 16/537,194

(22) Filed: Aug. 9, 2019

(51) Int. Cl.
*G01R 33/56* (2006.01)
*G01R 33/561* (2006.01)

(52) U.S. Cl.
CPC ..... *G01R 33/5605* (2013.01); *G01R 33/5612* (2013.01); *G01R 33/5614* (2013.01)

(58) Field of Classification Search
CPC ............ G01R 33/5605; G01R 33/5614; G01R 33/5612
See application file for complete search history.

(56) References Cited

U.S. PATENT DOCUMENTS

| | | | |
|---|---|---|---|
| 9,599,691 B2 * | 3/2017 | Paul | G01R 33/5607 |
| 2019/0011516 A1 * | 1/2019 | Sun | G01R 33/4838 |

OTHER PUBLICATIONS

Magnetic Resonance in Medicine, Kim et al., "Optimization of steady-state pulsed CEST imaging for amide proton transfer at 3T MRI", Jan. 29, 2019.

\* cited by examiner

*Primary Examiner* — Susan S Lee
(74) *Attorney, Agent, or Firm* — Loginov & Associates, PLLC; William A. Loginov

(57) ABSTRACT

Disclosed is an image acquisition method and apparatus using a parallel scheme of radio frequency irradiation and data acquisition. The image acquisition method includes saturating a labile proton by radiating a first radio frequency (RF) pulse signal to an object, generating a proton signal by radiating a pulse sequence signal to the object, and obtaining a chemical exchange saturation transfer (CEST) image of the object, and the generating and the obtaining of which are repeatedly performed in parallel.

20 Claims, 8 Drawing Sheets

IMAGE ACQUISITION METHOD AND APPARATUS USING PARALLEL SCHEME OF RADIO FREQUENCY IRRADIATION AND DATA ACQUISITION

BACKGROUND

1. Field

The following description relates to an image acquisition method and apparatus that may perform radio frequency (RF) irradiation and data acquisition in parallel.

2. Description of Related Art

Magnetic resonance imaging (MRI) refers to technology for obtaining an anatomical tomographic image of a human being. In general, the MRI obtains a signal from water protons that occupy a great portion of a human body, and may not be easy to obtain image information from a proton of other matters or materials which are relatively less distributed in the body.

Chemical exchange saturation transfer (CEST) is technology enabling the acquisition of image information of a matter or material that is relatively less distributed, which is not easily obtained by the MRI. It may obtain a signal from an abnormal tissue such as, for example, a cancer, which is distinguishable from a normal tissue, and is thus considered innovative enabling diagnosis of diseases without a contrast agent.

CEST MRI uses a phenomenon in which a chemical exchange occurs between a proton of water and a proton of a target matter or object. It saturates a labile proton of the target object that is present in a relatively less amount by radiating a radio frequency (RF) to the labile proton to allow the saturated labile proton to make a chemical exchange with the proton of water that is not saturated. Thus, the proton of water is indirectly saturated.

Such process is repeatedly performed to gradually saturate a large quantity of protons in water, and obtain an image from such water protons after the repetition.

A general MRI image may be obtained without such preparation process described above as a reference image, and CEST effect may be quantified by measuring a degree of saturation of a CEST MRI image, compared to the reference image.

Before obtaining an image, the existing CEST MRI may need such a long preparation process of repeatedly applying an RF to a labile proton until saturation of a water proton reaches a steady state.

In addition, to obtain an image with a high resolution or a high signal-to-noise ratio (SNR), image information may need to be obtained several times. However, a steady state of CEST effect may be disturbed each time image information is obtained, and thus a new preparation process may be needed. However, this may extend further an entire time to be used to capture or obtain an image.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

An aspect provides technology for performing radio frequency (RF) irradiation and data acquisition in parallel, and obtaining an image rapidly.

Another aspect also provides technology for increasing a contrast of an image obtained by chemical exchange saturation transfer (CEST) magnetic resonance imaging (MRI).

According to an example embodiment, there is provided an image acquisition method including saturating a labile proton by radiating a first RF pulse signal to an object, generating a proton signal by radiating a pulse sequence signal to the object, and obtaining a CEST image of the object from the generated proton signal. The generating and the obtaining may be repeatedly performed in parallel.

The saturating may include repeatedly radiating the first RF pulse signal until the labile proton reaches a steady state of saturation.

The generating and the obtaining may be performed to maintain the steady state while the pulse sequence signal and the first RF pulse signal are being applied in parallel.

The pulse sequence signal may include a second RF pulse signal to obtain a water proton signal, and a gradient signal to generate the proton signal.

A sum of the gradient signal may be a constant.

The gradient signal may include an x-direction gradient signal, a y-direction gradient signal, and a z-direction gradient signal.

A gradient momentum of the x-direction gradient signal, the y-direction gradient signal, and the z-direction gradient signal may have a same value each time image information is obtained.

The pulse sequence signal may be a steady-state free procession-free induction decay (SSFP-FID) pulse sequence.

The obtaining may include dividing the proton signal by a reference signal, obtaining a labile frequency corresponding to the labile proton from the proton signal divided by the reference signal, obtaining a symmetric proton signal with respect to a frequency symmetrical to the labile frequency based on a frequency corresponding to a water proton, obtaining the CEST image by removing a magnetization transfer (MT) effect using a difference between the symmetric proton signal and the proton signal.

The obtaining of the CEST image by removing the MT effect may include removing the MT effect using the following equation.

$$MTR_{asym}(+f) = \frac{S_{-f} - S_{+f}}{S_0} \quad \text{[Equation]}$$

In the equation above, $S_{+f}$ denotes the RF saturated signal, $S_{-f}$ denotes the symmetrically saturated signal, and $S_0$ denotes the reference signal.

According to another example embodiment, there is provided an image acquisition apparatus including a signal generator configured to saturate a labile proton by radiating a first RF pulse signal to an object, and generate a proton signal by radiating a pulse sequence signal to the object, and an image generator configured to obtain a CEST image of the object from the generated proton signal. The generating of the proton signal and the obtaining of the CEST image may be repeatedly performed in parallel.

The signal generator may repeatedly radiate the first RF pulse signal until the labile proton reaches a steady state of saturation.

The signal generator and the image generator may maintain the steady state while applying the pulse sequence signal and the first RF pulse signal in parallel.

The pulse sequence signal may include a second RF pulse signal to obtain a water proton signal, and a gradient signal to generate the proton signal.

A sum of the gradient signal may be a constant.

The gradient signal may include an x-direction gradient signal, a y-direction gradient signal, and a z-direction gradient signal.

A gradient momentum of the x-direction gradient signal, the y-direction gradient signal, and the z-direction gradient signal may have a same value each time image information is obtained.

The pulse sequence signal may be an SSFP-FID pulse sequence.

The image generator may divide the proton signal by a reference signal, obtain a labile frequency corresponding to the labile proton from the proton signal divided by the reference signal, obtain a symmetric proton signal with respect to a frequency symmetrical to the labile frequency based on a frequency corresponding to a water proton, and obtain the CEST image by removing an MT effect using a difference between the symmetric proton signal and the proton signal.

The image generator may remove the MT effect using the following equation.

$$MTR_{asym}(+f) = \frac{S_{-f} - S_{+f}}{S_0}$$ [Equation]

In the equation above, $S_{+f}$ denotes the RF saturated signal, $S_{-f}$ denotes the symmetric signal, and $S_0$ denotes the reference signal.

Other features and aspects will be apparent from the following detailed description, the drawings, and the claims.

Figure 1:
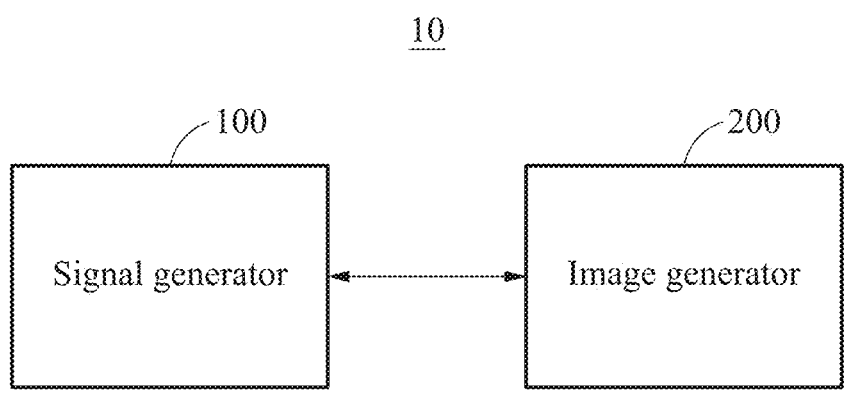
FIG. 1 illustrates an image acquisition apparatus according to an example embodiment.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

Hereinafter, example embodiments will be described in detail with reference to the accompanying drawings. However, various changes, modifications, and equivalents of the methods, apparatuses, and/or systems described herein will be apparent after an understanding of the present disclosure of this application. For example, the sequences of operations described herein are merely examples, and are not limited to those set forth herein, but may be changed as will be apparent after an understanding of the present disclosure, with the exception of operations necessarily occurring in a certain order.

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, operations, elements, and/or components, but do not preclude the presence or addition of one or more other features, integers, operations, elements, components, and/or groups thereof.

Terms such as first, second, A, B, (a), (b), and the like may be used herein to describe components. Each of these terminologies is not used to define an essence, order, or sequence of a corresponding component but used merely to distinguish the corresponding component from other component(s). For example, a first component may be referred to as a second component, and similarly the second component may also be referred to as the first component.

Unless otherwise defined, all terms, including technical and scientific terms, used herein have the same meaning as commonly understood by one of ordinary skill in the art to which this disclosure pertains based on an understanding of the present disclosure. Terms, such as those defined in commonly used dictionaries, are to be interpreted as having a meaning that is consistent with their meaning in the context of the relevant art and the present disclosure, and are not to be interpreted in an idealized or overly formal sense unless expressly so defined herein.

In addition, regarding the reference numerals assigned to the elements in the drawings, it should be noted that the same elements will be designated by the same reference numerals, wherever possible, even though they are shown in different drawings. Also, in the description of embodiments, detailed description of well-known related structures or functions will be omitted when it is deemed that such description will cause ambiguous interpretation of the present disclosure.

The term "module" described herein may indicate hardware to perform a function and an operation of each component described herein, a computer program code to perform a certain function and operation, or an electronic recording medium, for example, a processor and a microprocessor, in which a computer program code used to perform a certain function and operation is provided.

That is, a module described herein may indicate hardware to perform technical ideas of the present disclosure, and/or a functional and/or structural combination with software to operate the hardware.

FIG. 1 illustrates an image acquisition apparatus according to an example embodiment.

Referring to FIG. 1, an image acquisition apparatus 10 obtains a proton signal from an object by radiating a radio frequency (RF) signal to the object. The image acquisition apparatus 10 obtains an image from the obtained proton signal.

The object refers to a target from which an image is to be obtained. The object includes, for example, a human body.

The image acquisition apparatus 10 may obtain an image using a chemical exchange saturation transfer (CEST) magnetic resonance imaging (MRI) method.

MRI refers to technology used to obtain an anatomical tomographic image of a human being. In general, the MRI may obtain a signal from water protons that occupy a great portion of a human body. However, protons of other matters or materials that are not water protons are present in a relatively small amount in the body, and thus it may not be easy to obtain image information.

In contrast, CEST MRI may obtain a signal from a proton of a matter or material that is relatively less distributed and is not easy to be obtained by the existing MRI. Thus, the CEST MRI may obtain an image directly from a proton signal of a matter or material such as a tumor that is directly or indirectly related to a disease, and thus be used for accurate clinical diagnosis.

The image acquisition apparatus 10 performs, in parallel, a task of radiating of an RF signal to a labile proton and a task of obtaining image information, and may thus maintain a steady state of saturation of the labile proton throughout a whole process of imaging. In the present disclosure, the imaging may also be referred to as capturing or obtaining an image.

In addition, the image acquisition apparatus 10 does not require a new preparation process for saturation of a proton each time image information is obtained, and may thus considerably reduce an amount of time used to capture or obtain an image, compared to an existing CEST MRI method.

The image acquisition apparatus 10 may provide a new CEST MRI method of performing RF irradiation and image acquisition in parallel. The image acquisition apparatus 10 may simultaneously maintain a CEST mechanism and a steady state of an image signal. Thus, the image acquisition apparatus 10 may increase a speed of imaging by a factor of five times or more and accordingly reduce an amount of time used for imaging, and provide a magnetic resonance (MR) image having a more desirable contrast, compared to the existing CEST MRI method.

The image acquisition apparatus 10 includes a signal generator 100 and an image generator 200 as illustrated.

The signal generator 100 saturates a labile proton by radiating a first RF pulse signal to an object. The signal generator 100 generates a proton signal by radiating a pulse sequence signal to the object.

The signal generator 100 repeatedly radiates the first RF pulse signal until the labile proton reaches a steady state of saturation.

The image generator 200 obtains a CEST image of the object from the proton signal. The generating of the proton signal and the obtaining of the image may be repeatedly performed in parallel.

The signal generator 100 and the image generator 200 may generate the proton signal and obtain the image while maintaining the steady state by using the pulse sequence signal. The signal generator 100 and the image generator 200 may maintain the steady state by applying the pulse sequence signal and the first RF pulse signal in parallel.

The pulse sequence signal may include a second RF pulse signal to obtain a water proton signal, and a gradient signal to generate the proton signal. The pulse sequence signal may be, for example, a steady-state free procession-free induction decay (SSFP-FID) pulse sequence.

A sum of the gradient signal may be a constant. The gradient signal may include an x-direction gradient signal, a y-direction gradient signal, and a z-direction gradient signal. A gradient momentum of the x-direction gradient signal, the y-direction gradient signal, and the z-direction gradient signal may have a same value each time image information is obtained.

Figure 2:
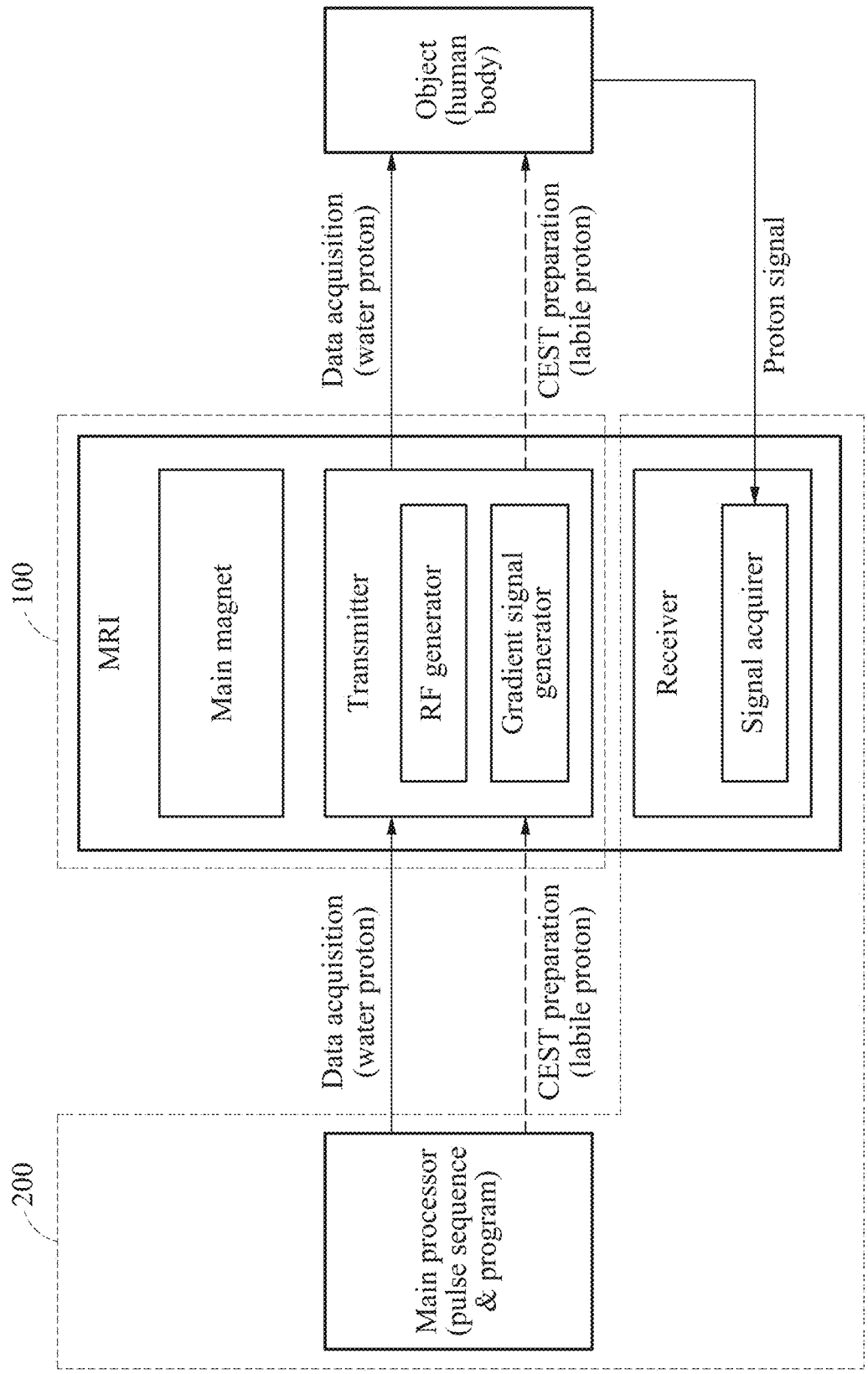
FIG. 2 illustrates an example of an operation of the image acquisition apparatus illustrated in FIG. 1.

FIG. 2 illustrates an example of an operation of the image acquisition apparatus 10 illustrated in FIG. 1.

Referring to FIG. 2, the image acquisition apparatus 10 includes the signal generator 100 and the image generator 200.

The signal generator 100 generates an RF signal and a gradient signal and radiates the generated signals to an object. The object may include, for example, a human body.

The signal generator 100 includes a main magnet configured to control a magnetic field. In addition, the signal generator 100 includes a transmitter. The transmitter includes an RF generator and a gradient signal generator.

The signal generator 100 generates a pulse sequence signal. The signal generator 100 radiates an RF pulse signal corresponding to a water proton to the object. The signal generator 100 prepares a CEST. The signal generator 100 saturates a labile proton using the gradient signal generator.

The image generator 200 receives a proton signal from the object through a signal acquirer included in a receiver. The image generator 200 includes a main processor. The main processor generates a CEST image from the proton signal.

The main processor outputs a control signal to the signal generator 100 to control the signal generator 100.

Figure 3:
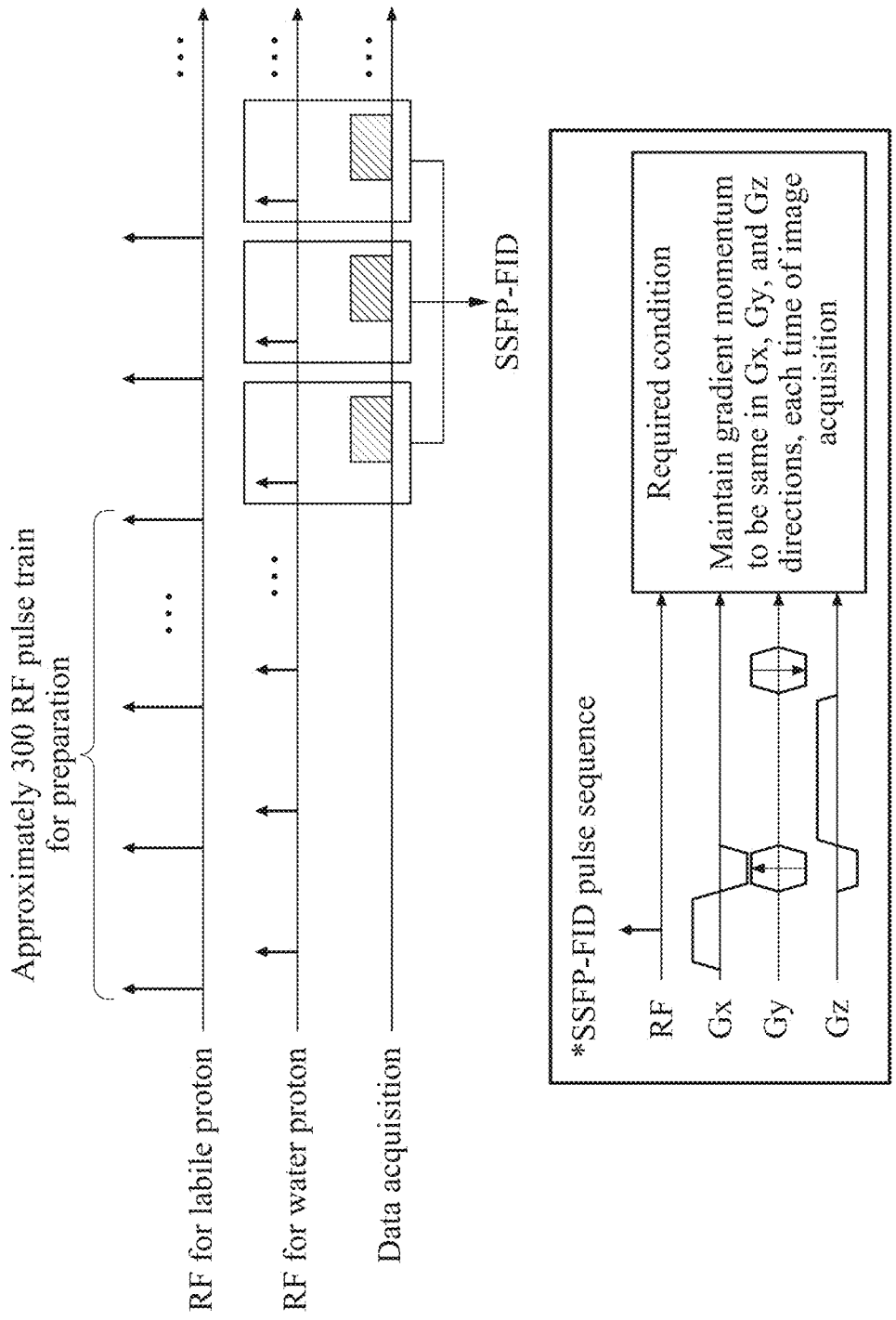
FIG. 3 illustrates an example of a pulse sequence signal for image acquisition according to an example embodiment.

FIG. 3 illustrates an example of a pulse sequence signal for image acquisition according to an example embodiment.

Referring to FIG. 3, the signal generator 100 radiates a first RF pulse signal to saturate a labile proton. The first RF pulse signal may be an RF signal corresponding to the labile proton.

The signal generator 100 repeatedly radiates the first RF pulse signal until the labile proton is saturated. For example, the signal generator 100 repeatedly radiates the first RF pulse signal about 300 times.

The signal generator 100 radiates a pulse sequence signal for image acquisition. The pulse sequence signal may include an RF signal corresponding to a water proton, and a gradient signal. The pulse sequence signal may be, for example, an SSFD-FID pulse sequence. The pulse sequence signal may include a second RF pulse signal corresponding to the water proton, and the gradient signal.

When obtaining a signal of a saturated water proton after applying a plurality of RF pulse signals, the image generator 200 may obtaining as many signals as possible, and thus reduce an amount of time used for imaging or obtaining an image in CEST MRI.

In a case of a spin echo or gradient echo sequence signal, a single signal may be obtained as an MR signal generated by applying an RF signal to a water proton. Thus, to form an image with N signals, 300 RF pulse signals may need to be repeatedly radiated N times.

In a case of using a multi-echo imaging method such as fast spin echo or echo planar imaging, m signals may be obtained by applying an RF pulse signal to a water proton and then continuously using the applied RF pulse signal. In such a case, 300 RF pulse signals may be radiated N/m times, and thus a time to be used may be reduced.

Such method as spin echo and gradient echo sequence may use an extremely great amount of time for image acquisition, although it provides a high contrast.

In addition, although such method as fast spin echo or echo planar imaging is used to solve an issue of the time for image acquisition, it may still use a great amount of time for image acquisition in CEST MRI for cancer diagnosis that requires a high resolution and a high signal-to-noise ratio (SNR), and thus may not be readily applicable to an actual clinical practice.

In addition, by performing, in parallel, a task of radiating an RF pulse signal and a task of obtaining image information to solve the foregoing issues, a loss in image contrast may occur to prevent an accurate diagnosis.

However, the image acquisition apparatus 10 may perform the task of radiating an RF pulse signal and the task of obtaining image information in parallel to enable fast imaging and provide a high contrast, compared to existing methods, thereby facilitating an accurate diagnosis of diseases including cancers.

To this end, the signal generator 100 may not eliminate a signal generated when an image is obtained. The signal generator 100 may use successively generated signals for a steady state, and obtain a new signal generated each time as a single signal along with them.

A water proton signal that is saturated due to image acquisition is not eliminated and returns to an unsaturated state again, and thus a proportion of water saturation may increase further by a CEST effect. Thus, the image generator 200 may provide an MR image with a higher contras, and facilitate an accurate diagnosis of cancers.

The image acquisition apparatus 10 may perform, in parallel, a task of radiating an RF pulse signal, for example, a second pulse signal, to a labile proton, and a task of obtaining image information. Thus, the image acquisition apparatus 10 may thus maintain a steady state of saturation of the labile proton throughout a whole process of imaging, for example, even while obtaining an image.

Thus, the image acquisition apparatus 10 may not require a new preparation process for the steady state of proton saturation each time image information is obtained, and thus considerably reduce an amount of time used for imaging, or capturing or obtaining an image.

An existing spoiled gradient echo (SPGR) method may eliminate completely an image signal generated in water after an image is obtained. Thus, while an RF pulse signal is being radiated for CEST, a portion of a water signal may be saturated by a spoiled gradient echo.

Thus, a water signal saturation rate in an obtained image may be reduced by a CEST effect, which may deteriorate a contrast of the image and make it difficult to diagnose a tumor and the like.

However, the image acquisition apparatus 10 may use an image signal generated for image acquisition to maintain the steady state without eliminating the image signal even after the image is obtained. Thus, the image acquisition apparatus 10 may increase an image contrast.

Figure 4:
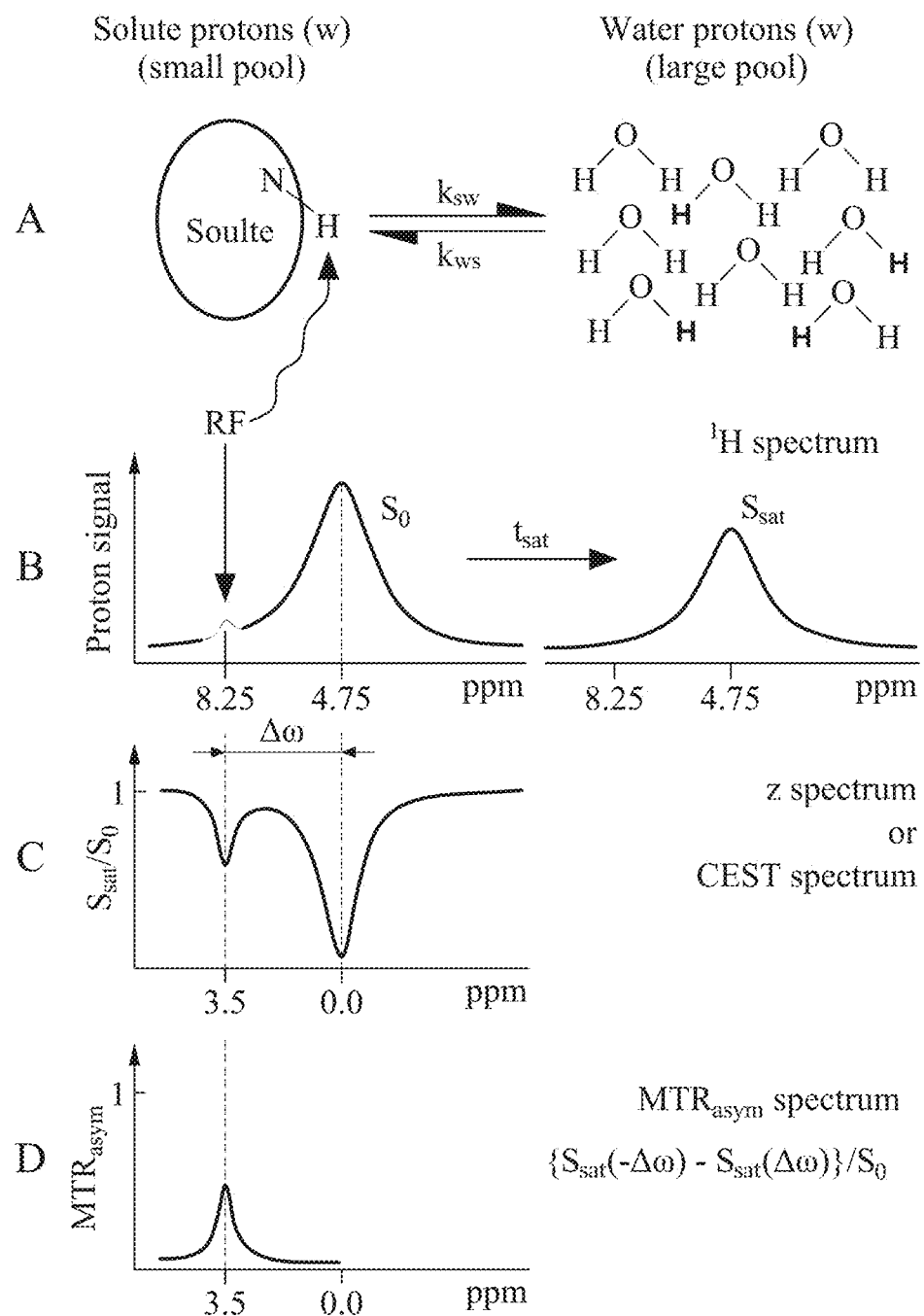
FIG. 4 illustrates an example of an operation performed by an image generator illustrated in FIG. 1 to obtain an image.

FIG. 4 illustrates an example of an operation performed by the image generator 200 illustrated in FIG. 1 to obtain an image.

Referring to FIG. 4, the image generator 200 may use a continuous chemical exchange between a water proton and a labile proton of another matter or material. In general, the water proton and the labile proton may have different frequencies in a main magnetic field of MRI.

When the signal generator 100 saturates the labile proton by radiating an RF pulse signal suitable for a frequency of the labile proton, for example, a first pulse signal, the saturated labile proton may make a chemical exchange with the water proton that is not saturated, and thus the water proton may be saturated indirectly. By repeatedly performing such process, the signal generator 100 may gradually saturate a large quantity of protons in water using a relatively small quantity of labile protons.

When a change in saturation of the labile proton and the water proton reaches a steady state, the image generator 200 may obtain an image $S_f$, or a proton signal, from the water proton. In addition, the image generator 200 may obtain a general MRI image $S_0$, or a reference signal, without a saturating operation, and obtain information of the labile proton by measuring saturation of a CEST MRI image compared to the general image.

That is, the image generator 200 may divide the proton signal by the reference signal. The dividing may be represented by Equation 1.

$$CEST(f) = \frac{S_f}{S_0} \quad \text{[Equation 1]}$$

In the example of FIG. 4, $S_f$ may correspond to $S_{sat}$.

The image generator 200 may saturate a proton of another polymer material being in a frequency domain of a certain material using a first RF pulse signal radiated to saturate a labile proton of the material.

The proton of the polymer material that is saturated with the first RF pulse signal may also saturate a water proton due to a magnetization transfer (MT) phenomenon, and thus make it difficult to accurately measure a CEST effect of the material. The image generator 200 may remove such an effect in saturating the water proton by the MT phenomenon.

In general, a material causing such MT phenomenon may be distributed in an extremely broad frequency band. When a frequency of a water proton is set to be 0 ppm, a frequency of a polymer material inducing such MT effect may be present symmetrically from 0 ppm.

The image generator 200 may obtain a labile frequency corresponding to the labile proton from the proton signal divided by the reference signal, and obtain a symmetric proton signal with respect to a frequency symmetrical to the labile frequency based on a frequency corresponding to the water proton.

Thus, to remove the MT effect, the image generator 200 may obtain a CEST image (or proton signal) from a frequency of a certain material (e.g., labile frequency) and obtain a CEST image (or symmetric proton signal) from a frequency on an opposite side with respect to the water proton (0 ppm). Subsequently, the image generator 200 may remove the MT effect by calculating a difference value between the two images, and obtain an image having only a CEST effect.

That is, the image generator 200 may obtain a CEST image by removing the MT effect using a difference between the symmetric proton signal and the proton signal. For example, the image generator 200 may remove the MT effect using Equation 2.

$$MTR_{asym}(+f) = \frac{S_{-f} - S_{+f}}{S_0} \quad \text{[Equation 2]}$$

In Equation 2, $S_{+f}$ denotes the RF saturated signal, $S_{-f}$ denotes the symmetrically saturated signal, and $S_0$ denotes the reference signal. In detail $S_{+f}$ indicates an image obtained by radiating an RF pulse signal of a frequency corresponding to a labile proton of a material to be measured, and $S_{-f}$ indicates an image obtained by radiating an RF pulse signal of a frequency on an opposite side based on water.

$S_0$ indicates a reference image, or a general MRI image, obtained without application of an RF pulse signal for saturation. The image generator 200 may obtain a signal having only the CEST effect using Equation 2.

A of FIG. 4 illustrates a chemical exchange between a water proton, and a proton of a certain material, for example, a solute proton or a labile proton. A left portion of B of FIG. 4 illustrates a graph of relative distribution of protons based on a frequency band.

As illustrated, a signal intensity is the greatest at 4.75 ppm, a frequency of water protons of a greatest amount. A right portion of B of FIG. 4 illustrates a graph indicating that 4.75 ppm, the intensity of water protons, decreases when the signal generator 100 applies an RF pulse signal of 8.52 ppm to saturate the material.

C of FIG. 4 is a graph of a value obtained by dividing a proton signal by a reference signal using Equation 1. When the signal generator 100 radiates an RF pulse signal to saturate a certain material while changing a frequency of the RF pulse signal, the image generator 200 may obtain $S_f$ (or $S_{sat}$) and divide this by a general MRI image $S_0$ which is a reference.

Based on a frequency of a water proton, the water proton may be present at 0 ppm. When the signal generator 100 applies an RF pulse signal for saturation at 0 ppm, the water proton may be directly saturated, and thus a signal ratio may be the least.

Since a proton of a material to be measured is present at 3.5 ppm away from 0 ppm, a signal intensity of the water proton may be reduced by a chemical exchange when the signal generator 100 applies an RF pulse signal for saturation at 3.5 ppm. D of FIG. 4 illustrates a measurement result based on Equation 2. The image generator 200 may remove an MT effect through Equation 2, and obtain an image having only an effect of CEST at 3.5 ppm.

Figure 5A:
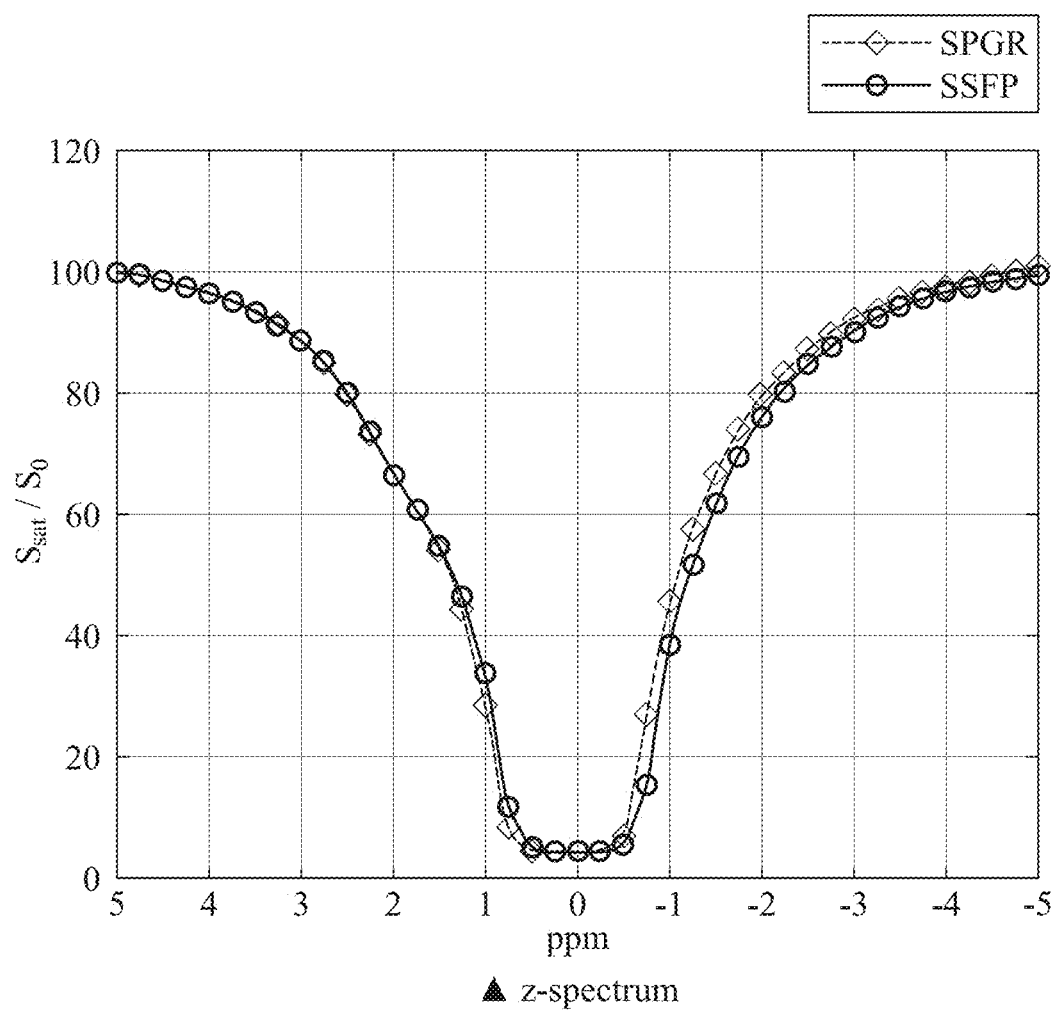
FIG. 5A illustrates an example of a z spectrum or a chemical exchange saturation transfer (CEST) spectrum used to compare an existing CEST magnetic resonance imaging (MRI) apparatus and the image acquisition apparatus illustrated in FIG. 1 in terms of performance.
Figure 5B:
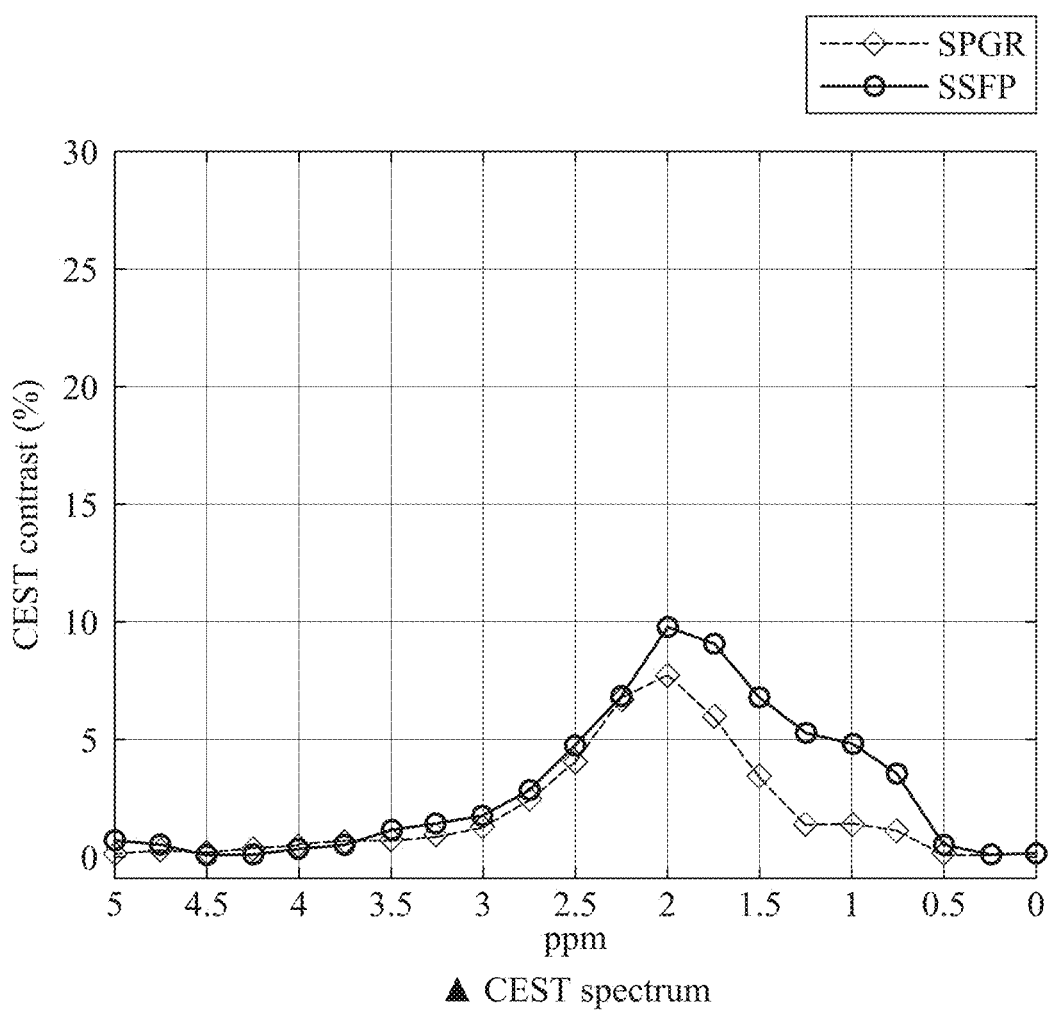
FIG. 5B illustrates an example of an asymmetric magnetization transfer ratio (MTR) spectrum used to compare the CEST MRI described with reference to FIG. 5A and the image acquisition apparatus illustrated in FIG. 1 in terms of performance.
Figure 6A:
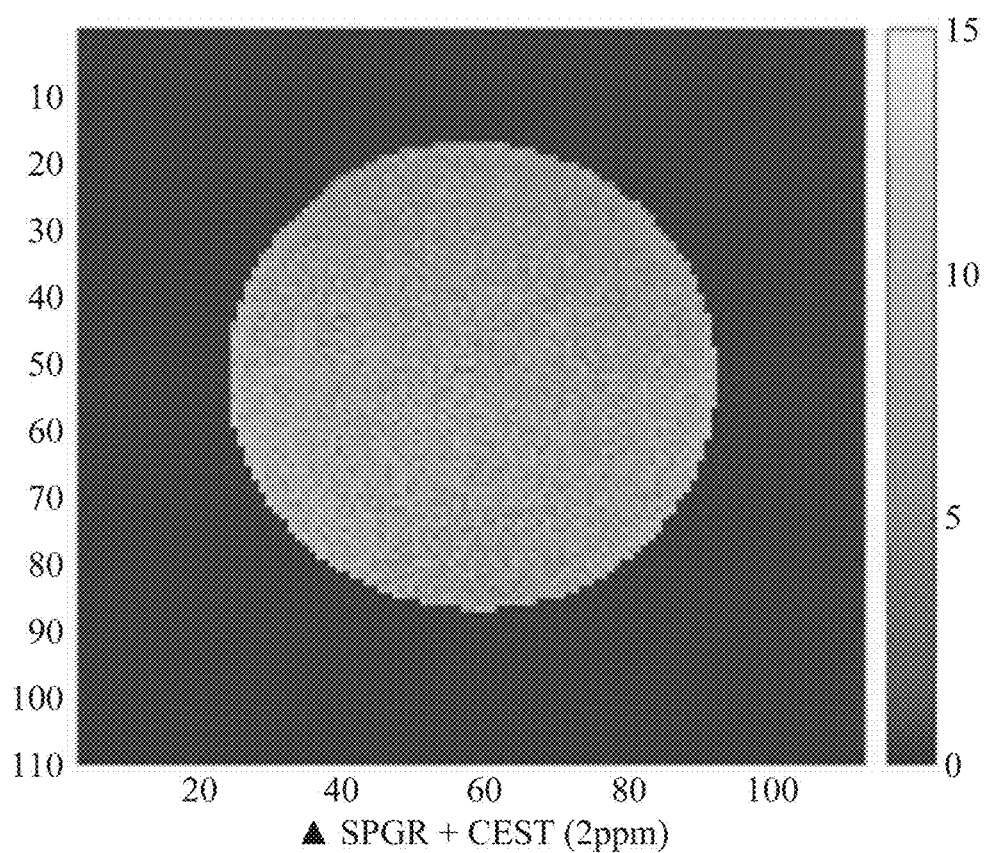
FIG. 6A illustrates an example of a CEST image obtained by an existing CEST MRI apparatus.
Figure 6B:
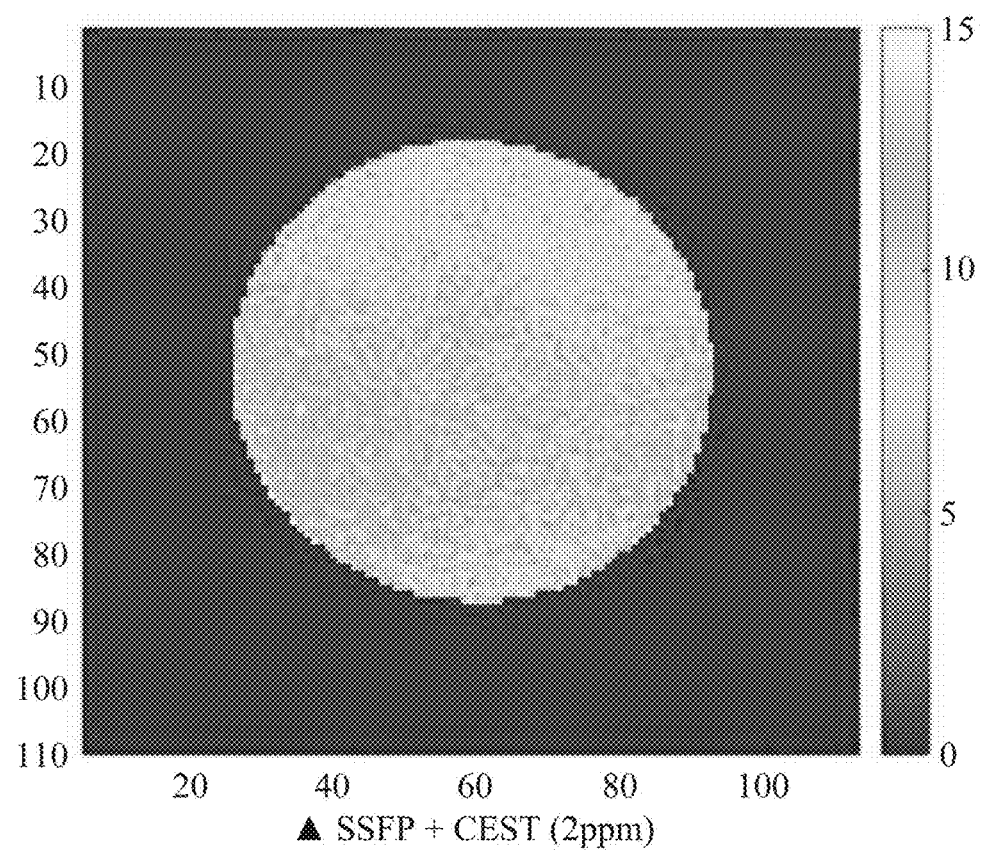
FIG. 6B illustrates an example of a CEST image obtained by the image acquisition apparatus illustrated in FIG. 1.

FIG. 5A illustrates an example of a z spectrum or a CEST spectrum used to compare an existing CEST MRI apparatus and the image acquisition apparatus 10 illustrated in FIG. 1 in terms of performance. FIG. 5B illustrates an example of an asymmetric magnetization transfer ratio (MTR) spectrum used to compare the CEST MRI described with reference to FIG. 5A and the image acquisition apparatus 10 illustrated in FIG. 1 in terms of performance. FIG. 6A is an example of a CEST image obtained by an existing CEST MRI apparatus, and FIG. 6B is an example of a CEST image obtained by the image acquisition apparatus 10 illustrated in FIG. 1.

Referring to FIGS. 5A through 6B, an existing CEST MM apparatus and the image acquisition apparatus 10 may differ from each other in terms of performance. To compare performance of each of the existing CEST MRI apparatus and the image acquisition apparatus 10, a creatine phantom having an amine proton (1.9 ppm) was used. For accurate comparison of SSFP-FID effect and SPGR effect, all parameters used were set to be the same in all the experiments.

The parameters used in the experiments were as indicated below in Table 1.

TABLE 1

| Parameter type | Parameter value |
| --- | --- |
| Repetition time (TR)/Echo time (TE) | 19/1.7 ms |
| RF flip angle for CEST effect | 220 degree |
| RF duration for CEST effect | 15.7 ms (bandwidth: 1 ppm at 3T MRI) |
| RF flip angle for image acquisition | 10 degree |
| Matrix size | 160 × 160 |
| Field-of-view (FOV) | 160 × 160 mm$^2$ |

As illustrated, the image acquisition apparatus 10 using SSFP-FID obtains an approximately 25% higher intensity, compared to the existing apparatus using SPGR. In addition, the image acquisition apparatus 10 provides a higher contrast, compared to the existing apparatus using SPGR.

Thus, the image acquisition apparatus 10 may enable a more accurate diagnosis compared to the existing apparatus using SPGR, and reduce an amount of time used for imaging, or capturing or obtaining an image, by a factor of approximately eight times compared to existing spin echo, gradient echo sequence, fast spin echo, and echo planar imaging methods.

The units described herein may be implemented using hardware components and software components. For example, the hardware components may include microphones, amplifiers, band-pass filters, audio to digital convertors, non-transitory computer memory and processing devices. A processing device may be implemented using one or more general-purpose or special purpose computers, such as, for example, a processor, a controller and an arithmetic logic unit (ALU), a digital signal processor, a microcomputer, a field programmable gate array (FPGA), a programmable logic unit (PLU), a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such a parallel processors.

The software may include a computer program, a piece of code, an instruction, or some combination thereof, to independently or collectively instruct or configure the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. The software and data may be stored by one or more non-transitory computer readable recording mediums. The non-transitory computer readable recording medium may include any data storage device that can store data which can be thereafter read by a computer system or processing device.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

What is claimed is:

1. An image acquisition method comprising:
    saturating a labile proton by radiating a first radio frequency (RF) pulse signal to an object;
    generating a proton signal by radiating a pulse sequence signal to the object; and
    obtaining a chemical exchange saturation transfer (CEST) image of the object from the generated proton signal, wherein the generating and the obtaining are repeatedly performed in parallel.

2. The image acquisition method of claim 1, wherein the saturating comprises:
    repeatedly radiating the first RF pulse signal until the labile proton reaches a steady state of saturation.

3. The image acquisition method of claim 2, wherein the generating and the obtaining are performed to maintain the steady state while the pulse sequence signal and the first RF pulse signal are being applied in parallel.

4. The image acquisition method of claim 1, wherein the pulse sequence signal includes a second RF pulse signal to obtain a water proton signal, and a gradient signal to generate the proton signal.

5. The image acquisition method of claim 4, wherein a sum of the gradient signal is a constant.

6. The image acquisition method of claim 4, wherein the gradient signal includes an x-direction gradient signal, a y-direction gradient signal, and a z-direction gradient signal.

7. The image acquisition method of claim 6, wherein a gradient momentum of the x-direction gradient signal, the y-direction gradient signal, and the z-direction gradient signal has a same value each time image information is obtained.

8. The image acquisition method of claim 4, wherein the pulse sequence signal is a steady-state free procession-free induction decay (SSFP-FID) pulse sequence.

9. The image acquisition method of claim 1, wherein the obtaining comprises:
    dividing the proton signal by a reference signal;
    obtaining a labile frequency corresponding to the labile proton from the proton signal divided by the reference signal;
    obtaining a symmetric proton signal with respect to a frequency symmetrical to the labile frequency based on a frequency corresponding to a water proton;
    obtaining the CEST image by removing a magnetization transfer (MT) effect using a difference between the symmetric proton signal and the proton signal.

10. The image acquisition method of claim 9, wherein the obtaining of the CEST image by removing the MT effect comprises:
    removing the MT effect using the following equation, $$MTR_{asym}(+f) = \frac{S_{-f} - S_{+f}}{S_0}$$

wherein $S_{+f}$ denotes a RF saturated signal, $S_{-f}$ denotes a symmetrically saturated signal, and $S_0$ denotes the reference signal.

11. An image acquisition apparatus comprising:
    a signal generator configured to saturate a labile proton by radiating a first radio frequency (RF) pulse signal to an object, and generate a proton signal by radiating a pulse sequence signal to the object; and
    an image generator configured to obtain a chemical exchange saturation transfer (CEST) image of the object from the generated proton signal,
        wherein the generating of the proton signal and the obtaining of the CEST image are repeatedly performed in parallel.

12. The image acquisition apparatus of claim 11, wherein the signal generator is configured to repeatedly radiate the first RF pulse signal until the labile proton reaches a steady state of saturation.

13. The image acquisition apparatus of claim 12, wherein the signal generator and the image generator are configured to maintain the steady state while applying the pulse sequence signal and the first RF pulse signal in parallel.

14. The image acquisition apparatus of claim 11, wherein the pulse sequence signal includes a second RF pulse signal to obtain a water proton signal, and a gradient signal to generate the proton signal.

15. The image acquisition apparatus of claim 14, wherein a sum of the gradient signal is a constant.

16. The image acquisition apparatus of claim 14, wherein the gradient signal includes an x-direction gradient signal, a y-direction gradient signal, and a z-direction gradient signal.

17. The image acquisition apparatus of claim 16, wherein a gradient momentum of the x-direction gradient signal, the y-direction gradient signal, and the z-direction gradient signal has a same value each time image information is obtained.

18. The image acquisition apparatus of claim 17, wherein the pulse sequence signal is a steady-state free procession-free induction decay (SSFP-FID) pulse sequence.

19. The image acquisition apparatus of claim 11, wherein the image generator is configured to:
    divide the proton signal by a reference signal;
    obtain a labile frequency corresponding to the labile proton from the proton signal divided by the reference signal;
    obtain a symmetric proton signal with respect to a frequency symmetrical to the labile frequency based on a frequency corresponding to a water proton; and
    obtain the CEST image by removing a magnetization transfer (MT) effect using a difference between the symmetric proton signal and the proton signal.

20. The image acquisition apparatus of claim 19, wherein the image generator is configured to remove the MT effect using the following equation, $$MTR_{asym}(+f) = \frac{S_{-f} - S_{+f}}{S_0}$$

wherein $S_{+f}$ denotes a RF saturated signal, $S_{-f}$ denotes a symmetrically saturated signal, and $S_0$ denotes the reference signal.

\* \* \* \* \*